US009165965B2

(12) United States Patent
Ariga

(10) Patent No.: US 9,165,965 B2
(45) Date of Patent: Oct. 20, 2015

(54) IMAGE SENSING APPARATUS

(71) Applicant: CANON KABUSHIKI KAISHA, Tokyo (JP)

(72) Inventor: Yuichi Ariga, Tokyo (JP)

(73) Assignee: CANON KABUSHIKI KAISHA, Tokyo (JP)

(*) Notice: Subject to any disclaimer, the term of this patent is extended or adjusted under 35 U.S.C. 154(b) by 233 days.

(21) Appl. No.: 14/027,819

(22) Filed: Sep. 16, 2013

(65) Prior Publication Data
US 2014/0084139 A1 Mar. 27, 2014

(30) Foreign Application Priority Data

Sep. 21, 2012 (JP) .................. 2012-208896
Sep. 10, 2013 (JP) .................. 2013-187647

(51) Int. Cl.
H01L 27/146 (2006.01)
(52) U.S. Cl.
CPC .... *H01L 27/14627* (2013.01); *H01L 27/14605* (2013.01)
(58) Field of Classification Search
CPC ............... H01L 27/14627; H01L 27/14605; G02B 3/0037; H04N 5/2254; H04N 5/2257

USPC ............. 250/208.1, 201.9; 348/360, 340
See application file for complete search history.

(56) References Cited

U.S. PATENT DOCUMENTS

| 7,123,417 B2 * | 10/2006 | Ishikawa et al. ............... 359/618 |
| 2008/0088813 A1 * | 4/2008 | Takashima et al. ............. 355/67 |
| 2008/0191604 A1 * | 8/2008 | Morris et al. ................. 313/499 |

OTHER PUBLICATIONS

Light Field Photography with a Hand-held Plenoptic Camera, Stanford University Computer Science Tech Report CTSR Feb. 2005, Ren Ng, et al, Feb. 2005.

* cited by examiner

*Primary Examiner* — Seung C Sohn
(74) *Attorney, Agent, or Firm* — Cowan, Liebowitz & Latman, P.C.

(57) ABSTRACT

Each microlens exhibits a distortion aberration characteristic in which the ratio of a range where a light beam having passed through the microlens forms an image on a predetermined number of pixels associated with the microlens when the imaging optical system takes the second f-number, to a range where a light beam having passed through the microlens forms an image when the imaging optical system takes the first f-number is higher than the ratio of the first f-number to the second f-number.

11 Claims, 8 Drawing Sheets

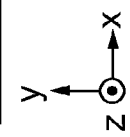
FIG. 4A
FIG. 4B

F I G. 5
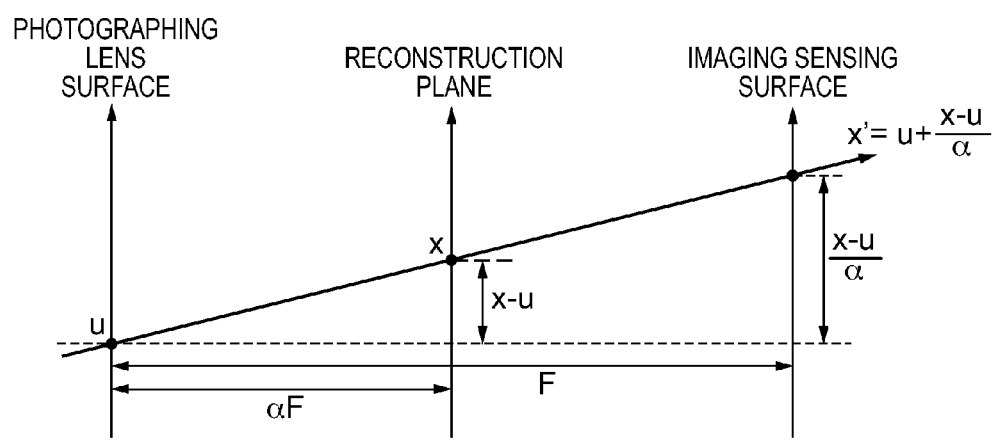

IMAGE SENSING APPARATUS

BACKGROUND OF THE INVENTION

1. Field of the Invention

The present invention relates to an image sensing apparatus and, more particularly, to a technique of generating an image focused on an arbitrary focal length from output data after photography.

2. Description of the Related Art

Recently, there has been proposed a technique of storing the intensity distribution and traveling direction of light at the time of photography in an image sensing apparatus such as a digital camera, thereby generating an image focused on an arbitrary focal length from output data after storage.

Ren. Ng, et al. ("Light Field Photography with a Hand-Held Plenoptic Camera", Stanford University Computer Science Tech Report CTSR 2005 February) discloses a method (Light Field Photography) of separating and storing light beams coming from various directions by forming images of light beams having passed through different pupil regions of the imaging optical system on the pixels (photoelectric conversion elements) of an image sensor via a microlens array. In the obtained output data (Light Field Data: to be referred to as LF data hereinafter), light beams coming from different directions are stored in adjacent pixels. By extracting light beams in the same direction from pixels associated with respective microlenses, an image photographed from this direction can be generated from the LF data. Also, the pixel of an image focused on a specific focal length can be generated (reconstructed) after photography by setting an arbitrary focal length and adding outputs from pixels which store light beams having passed through one point on a focal plane at this focal length.

In an image sensing apparatus using the method as disclosed in Ren. Ng, microlenses are designed in accordance with the effective aperture of the imaging optical system so that the pixels of an image sensor which are assigned to the respective lenses of the microlens array cover light beams having passed through all the regions of the exit pupil of the imaging optical system. This image sensing apparatus is premised on that the f-number (focal length/effective aperture) of the imaging optical system and that of each microlens of the microlens array coincide with each other. However, in an image sensing apparatus such as a lens-interchangeable digital single-lens reflex camera, the f-number of the mounted imaging optical system may change. For this reason, when a reconstructed image focused on an arbitrary focal length is generated from LF data obtained by photography using the method as disclosed in Ren. Ng (non-patent literature 1), no preferable reconstructed image may be generated.

SUMMARY OF THE INVENTION

The present invention was made in view of such problems in the conventional technique. The present invention provides an image sensing apparatus that outputs preferable LF data corresponding to the imaging optical system having different f-numbers.

The present invention in its first aspect provides an image sensing apparatus including: an imaging optical system; an image sensor configured to include a plurality of pixels and photoelectrically convert a light beam having passed through the imaging optical system; and an array of microlenses configured to form, on the respective pixels of the image sensor, images of light beams different in a combination of a pupil region of the imaging optical system through which the light beam has passed, and an incident direction, wherein the microlens has a distortion aberration characteristic in which aberration becomes stronger as an image height in the microlens becomes higher.

The present invention in its second aspect provides an image sensing apparatus including: an imaging optical system; an image sensor configured to include a plurality of pixels and photoelectrically convert a light beam having passed through the imaging optical system; and an array of microlenses configured to form, on the respective pixels of the image sensor, images of light beams different in a combination of a pupil region of the imaging optical system through which the light beam has passed, and an incident direction, comprising: a first correction unit configured to correct distortion aberration caused by the microlens for an image signal obtained by the photoelectric conversion; a second correction unit configured to correct distortion aberration caused by the imaging optical system; and a storage unit configured to encode and store an image output from the second correction unit.

The present invention in its third aspect provides an image sensing apparatus including: an imaging optical system configured to take a first f-number and a second f-number larger than the first f-number; an image sensor configured to include a plurality of pixels and photoelectrically convert a light beam having passed through the imaging optical system; and an array of microlenses configured to form, on the respective pixels of the image sensor, images of light beams different in a combination of a pupil region of the imaging optical system through which the light beam has passed, and an incident direction, each microlens being associated with a predetermined number of pixels of the image sensor, wherein the microlens has a distortion aberration characteristic in which a ratio of a range where a light beam having passed through the microlens forms an image on the predetermined number of pixels associated with the microlens when the imaging optical system takes the second f-number, to a range where a light beam having passed through the microlens forms an image when the imaging optical system takes the first f-number is higher than a ratio of the first f-number to the second f-number.

Further features of the present invention will become apparent from the following description of exemplary embodiments (with reference to the attached drawings).

BRIEF DESCRIPTION OF THE DRAWINGS

FIGS. 4A and 4B are views showing the correspondence between the respective regions of the exit pupil 301 and photoelectric conversion elements associated with each microlens according to the embodiment of the present invention;

FIG. 5 is a graph for explaining the relationship between a light beam passing through a specific position on the reconstruction plane, and a passing position on the imaging sensing surface according to the embodiment of the present invention;

DESCRIPTION OF THE EMBODIMENTS

Embodiment

An exemplary embodiment of the present invention will now be described in detail with reference to the accompanying drawings. An embodiment to be described below will explain an example in which the present invention is applied to a digital camera capable of generating, from LF data after photography, an image focused on a subject at a specific focal length. However, the present invention is applicable to an arbitrary device capable of generating, from LF data, an image focused on a subject at a specific focal length.

In this specification, the following terms will be defined and explained.

"Light Field (LF) data"

An image signal output from an imaging sensing unit 106 of a digital camera 100 according to the embodiment. The respective pixels of the image sensor exhibit signal strengths corresponding to light beams different in a combination of a pupil region of an imaging optical system 104 through which the light beam has passed, and the incident direction. The LF data is also called ray-space information.

"Reconstructed Image"

An image which is generated from LF data and focused on an arbitrary focal length. More specifically, the pixels of LF data are rearranged in accordance with the pixel arrangement on a focal plane (reconstruction plane) corresponding to a focal length at which an image is generated. Then, the pixel values of pixels corresponding to one pixel of a reconstructed image are added, thereby obtaining the pixel value of this pixel. The pixel arrangement on the reconstruction plane is determined based on the incident direction of a light beam incident when the image sensor exists on the reconstruction plane. One pixel of a reconstructed image can be generated by adding the pixel values of pixels corresponding to one microlens in the pixel arrangement.

<<Arrangement of Digital Camera 100>>

Figure 1:
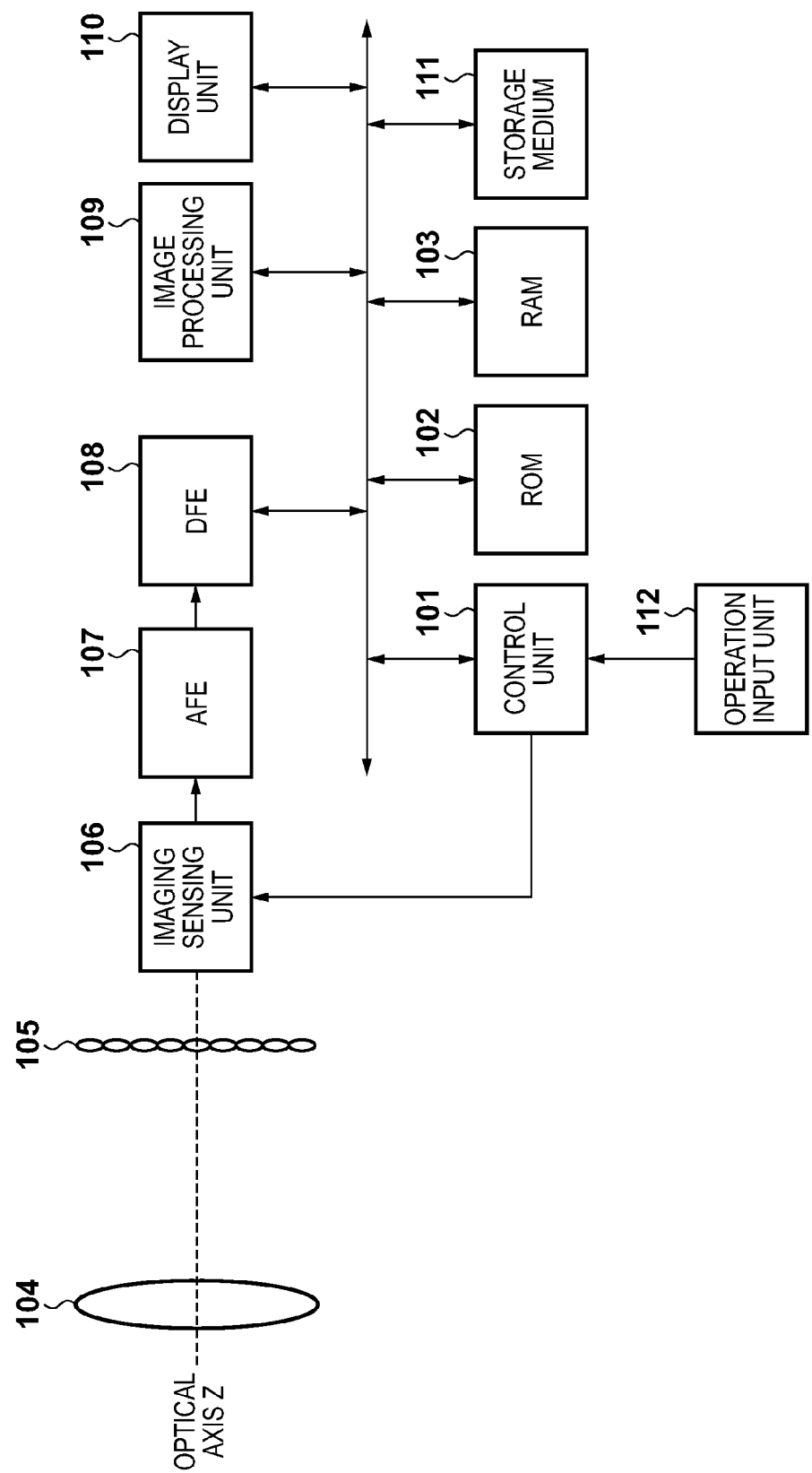
FIG. 1 is a block diagram showing the functional arrangement of a digital camera 100 according to an embodiment of the present invention.

FIG. 1 is a block diagram showing the functional arrangement of the digital camera 100 according to the embodiment of the present invention.

A control unit 101 is, for example, a CPU, and controls the operation of each block of the digital camera 100. More specifically, the control unit 101 controls the operation of each block by reading out the operation program of photographing processing or refocus moving image generation processing (to be described later) stored in a ROM 102, expanding it in a RAM 103, and executing it.

The ROM 102 is, for example, a rewritable non-volatile memory, and stores parameters and the like necessary for the operation of each block, in addition to the operation program of each block of the digital camera 100.

The RAM 103 is a volatile memory. The RAM 103 is used not only as an expansion area for the operation program of each block of the digital camera 100, but also as a storage area for storing intermediate data and the like output in the operation of each block.

The imaging sensing unit 106 is, for example, an image sensor such as a CCD or CMOS sensor. Upon receiving a timing signal output from a timing generator (TG: not shown) in accordance with an instruction from the control unit 101, the imaging sensing unit 106 photoelectrically converts an optical image formed on the photoelectric conversion element surface of the image sensor via the imaging optical system 104, and outputs an analog image signal. Note that the imaging optical system 104 includes, for example, an objective lens, focus lens, and stop. The digital camera 100 according to the embodiment includes a microlens array 105 interposed between the imaging optical system 104 and the image sensor on the optical axis, in addition to microlenses arranged for the respective photoelectric conversion elements of the image sensor.

<Relationship Between Microlens and Photoelectric Conversion Element>

The microlens array 105 interposed between the imaging optical system 104 and the image sensor on the optical axis in the digital camera 100 according to the embodiment will be described with reference to the accompanying drawings.

Figure 2:
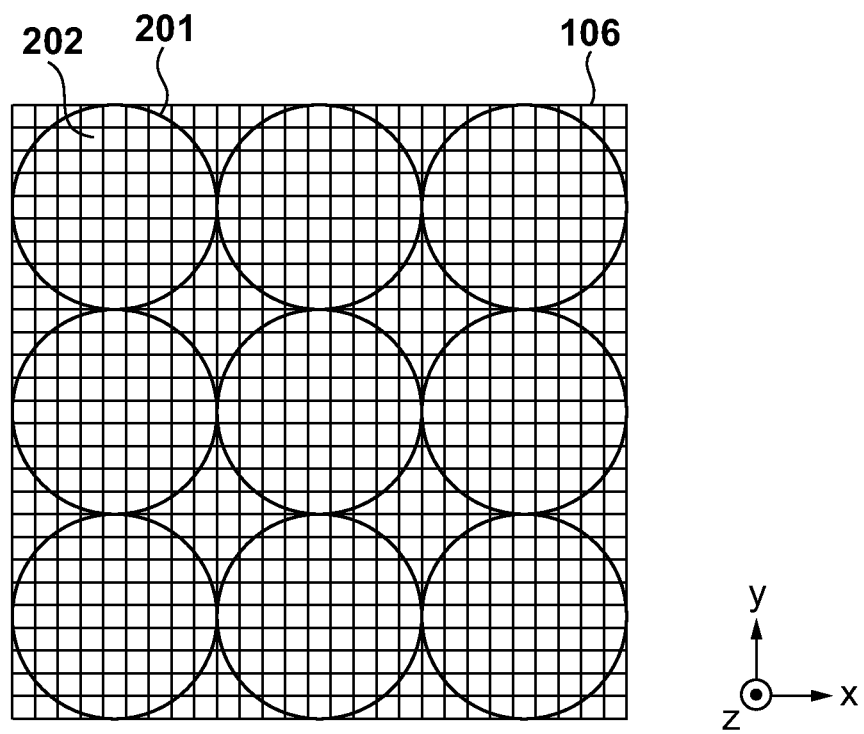
FIG. 2 is a view for explaining the relationship between a microlens array 105 and an imaging sensing unit 106 according to the embodiment of the present invention.

As shown in FIG. 2, the microlens array 105 according to the embodiment is constructed from a plurality of microlenses 201. In FIG. 2, the optical axis of the imaging optical system 104 serves as the z-axis, the horizontal direction of the digital camera 100 at a landscape position serves as the x-axis, and the vertical direction serves as the y-axis. In the example of FIG. 2, the microlens array 105 is constructed from 3×3 microlenses 201 for simplicity, but the arrangement of the microlens array 105 is not limited to this.

In FIG. 2, photoelectric conversion elements 202 of the image sensor forming the imaging sensing unit 106 are illustrated as grids. A predetermined number of photoelectric conversion elements 202 are associated with each microlens 201. In the example of FIG. 2, the photoelectric conversion elements 202 of 9×9=81 pixels are associated with one microlens 201. Light beams having passed through one microlens 201 are separated in accordance with their incident directions and form images on the corresponding photoelectric conversion elements 202.

Figure 3:
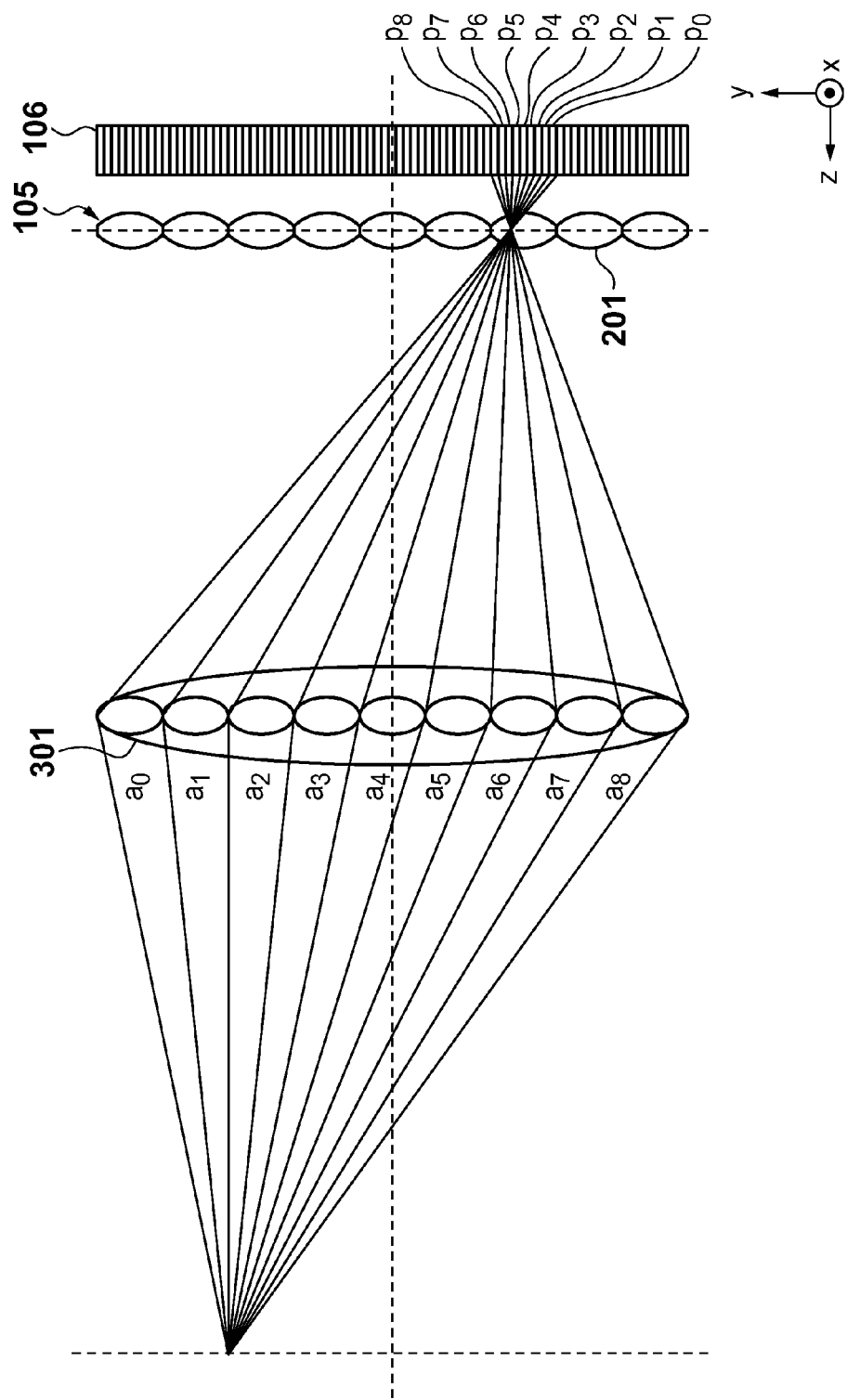
FIG. 3 is a view for explaining the relationship between a light beam having passed through each region of an exit pupil 301 and a photoelectric conversion element which photoelectrically converts the light beam according to the embodiment of the present invention.

FIG. 3 illustrates light beams entering photoelectric conversion elements $202p_0$ to $202p_8$ corresponding to one microlens 201 when the f-number of the imaging optical system 104 and that of each microlens of the microlens array 105 almost coincide with each other. In FIG. 3, the upward direction corresponds to the upward vertical direction. FIG. 3 exemplifies the optical path of a light beam entering each photoelectric conversion element 202 when viewed from the lateral direction in a state in which the digital camera 100 is at a landscape position. As shown in FIG. 3, light beams having passed through nine vertically divided regions $a_0$ to $a_8$ of an exit pupil 301 of the imaging optical system 104 enter the photoelectric conversion elements $202p_0$ to $202p_8$ arranged in the horizontal direction via one microlens 201. Note that a numeral added to each region represents the correspondence with the photoelectric conversion element 202 which a traveling light beam enters.

The example of FIG. 3 shows the optical path of a light beam entering each photoelectric conversion element 202 when viewed from the lateral direction. However, light beams are separated not only in the vertical direction but also in the horizontal direction. More specifically, when the exit pupil 301 of the imaging optical system 104 is divided into regions as shown in FIG. 4A, light beams having passed through the respective regions enter photoelectric conversion elements having the same identification numerals among the photoelectric conversion elements 202 as shown in FIG. 4B. Also in the example of FIGS. 4A and 4B, the f-number of the imaging optical system 104 and that of each microlens of the microlens array 105 almost coincide with each other.

An AFE 107 and DFE 108 perform correction processing and the like for an image signal generated by the imaging sensing unit 106. More specifically, the AFE 107 performs reference level adjustment (clamp processing) and A/D conversion processing for an analog image signal output from the imaging sensing unit 106, and outputs LF data to the DFE 108. The DFE 108 corrects a small reference level shift and the like for the input LF data.

An image processing unit 109 applies various image processes such as color conversion processing for LF data having undergone correction processing by the DFE 108. In the embodiment, the image processing unit 109 also performs processing of generating, from LF data, an image (reconstructed image) focused on an arbitrary focal length. The reconstructed image can be generated using a "Light Field Photography" method as disclosed in Ren. Ng.

<Reconstructed Image Generation Method>

An outline of a reconstructed image generation method will be explained with reference to the accompanying drawings.

In the digital camera 100 according to the embodiment, as described above, respective pixels assigned to one microlens receive light beams having passed through different regions of the exit pupil of the imaging lens. This also applies to all the microlenses of the microlens array 105. Since light beams having passed through the imaging lens enter the respective microlenses from different directions, all the pixels of the image sensor receive light beams entering from different directions.

Each light beam will be defined and described such that the optical axis of a light beam entering each pixel of LF data obtained by photography is defined by the coordinates (u, v) of a pupil region of the exit pupil through which the light beam has passed, and the position coordinates (x', y') of a corresponding microlens. In generation of a reconstructed image, a pixel value can be obtained by integrating a light beam having an optical path passing through the point of a pixel (x, y) on a reconstruction plane corresponding to an arbitrary focal length at which a reconstructed image is generated.

FIG. 5 shows the optical path of a light beam on a horizontal plane (x-z plane) when viewed from the vertical direction of the digital camera 100 at a landscape position. Although the optical path of a light beam passing through each pixel of the reconstruction plane on the x-z plane will be explained, this also applies to the y-z plane.

Letting (u, v) be the coordinates of the pupil region and (x, y) be the coordinates of a pixel on the reconstruction plane, the position coordinates (x', y') of a microlens on the microlens array 105 which a light beam having passed through the pupil division region and the pixel on the reconstruction plane enters are given by $$(x', y') = \left(u + \frac{x-u}{\alpha}, v + \frac{y-v}{\alpha}\right)$$

where F is the distance from the imaging lens to the microlens array, and αF is the distance from the photographing lens to the reconstruction plane (α is the refocus coefficient: a variable coefficient for determining a distance to the reconstruction plane).

Letting L(x', y', u, v) be an output from a photoelectric conversion element which receives the light beam, a pixel output E(x, y) at the coordinates (x, y) of an image formed on the reconstruction plane is obtained by integrating L(x', y', u, v) with respect to the pupil region of the photographing lens, and is given by $$E(x, y) = \frac{1}{\alpha^2 F^2} \int \int L\left(u + \frac{x-u}{\alpha}, v + \frac{y-v}{\alpha}, u, v\right) du dv$$

This equation can be solved by simple addition by setting (u, v) as the typical coordinates of the pupil region.

A display unit 110 is a display device of the digital camera 100, such as a compact LCD. The display unit 110 displays an image which is generated by the image processing unit 109 and focused on an arbitrary focal length. As described above, images are not successive in adjacent pixels in LF data obtained by A/D-converting analog image signals output from the imaging sensing unit 106 according to the embodiment. For this reason, the display unit 110 displays not the LF data but image data generated by the image processing unit 109.

A storage medium 111 is, for example, a built-in memory of the digital camera 100 or a storage device detachably connected to the digital camera 100 such as a memory card or HDD. The storage medium 111 stores LF data, and an image which is generated from these LF data and focused on an arbitrary focal length.

An operation input unit 112 is a user interface of the digital camera 100, including a power button, shutter button, and the like. When the operation input unit 112 detects that the user has operated the user interface, it outputs a control signal corresponding to this operation to the control unit 101.

<<Problem when F-Numbers of Imaging Optical System 104 and Each Microlens are Different>>

A problem generated when the f-number $f_{system}$ of the imaging optical system 104 and the f-number $f_{micro}$ of each microlens of the microlens array 105 do not coincide with each other, which is also a problem in the present invention, will be explained with reference to the accompanying drawings. In the following description, the imaging optical system 104 having f-numbers f2.8 and f5.6 is used in photography with the digital camera 100. However, the practice of the present invention is not limited to these f-numbers.

<Case of $f_{system} < f_{micro}$>

Figure 6A:
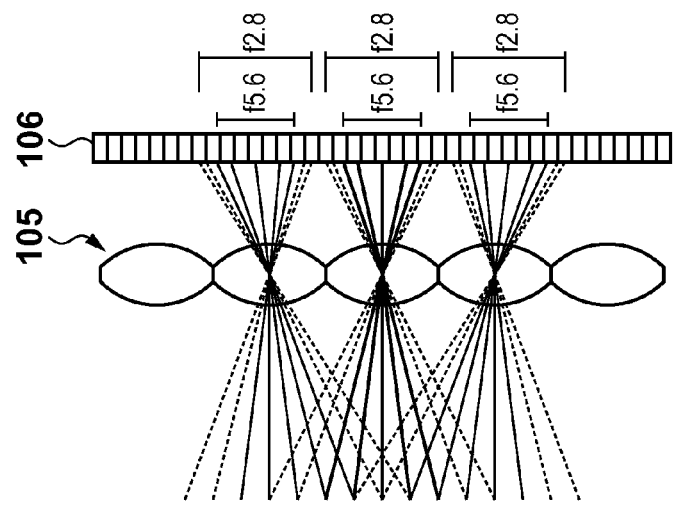
FIGS. 6A, 6B and 6C are views for explaining the distortion aberration characteristic of the microlens according to the embodiment of the present invention.

A case in which a light beam having passed through the exit pupil 301 when the f-number of the microlens 201 is f2.8 and that of the imaging optical system 104 is f2.8 is designed to form an image on photoelectric conversion elements associated with one microlens 201 will be examined. At this time, if the f-number of the imaging optical system 104 is changed to f5.6 upon a change of the lens or the like, the effective aperture of the imaging optical system 104 is decreased, that is, the exit pupil 301 of the imaging optical system 104 is narrowed. The range where a light beam forms an image on the photoelectric conversion elements associated with one microlens 201 is therefore narrowed, as shown in FIG. 6A. More specifically, the maximum vertical or horizontal length of the range where a light beam forms an image when the imaging optical system 104 takes f2.8 is defined as 1. Then, when the imaging optical system 104 takes f5.6, the length becomes 2.8/5.6=½ based on the ratio of the f-numbers. A reconstructed image generated from LF data obtained at this time is lower in resolution than a reconstructed image generated from LF data obtained when the f-number of the microlens 201 is f5.6.

<Case of $f_{system} > f_{micro}$>

Figure 6B:
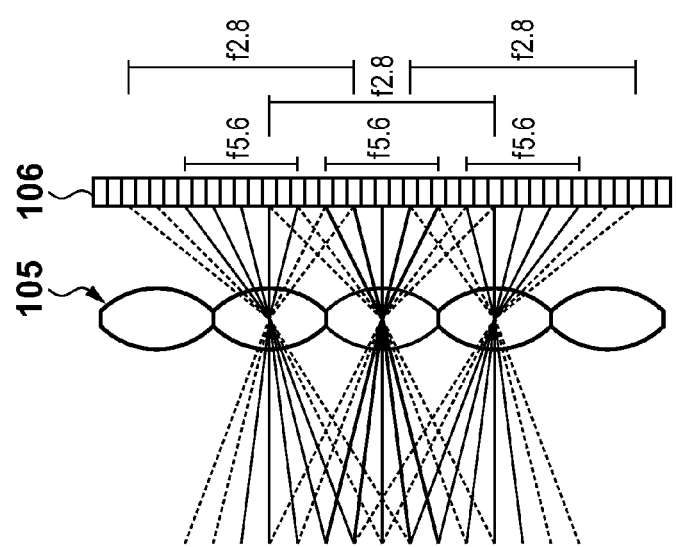

A case in which a light beam having passed through the exit pupil 301 when the f-number of the microlens 201 is f5.6 and that of the imaging optical system 104 is f5.6 is designed to form an image on photoelectric conversion elements associated with one microlens 201 will be considered. At this time, if the f-number of the imaging optical system 104 is changed to f2.8, the effective aperture of the imaging optical system 104 is increased, that is, the exit pupil 301 of the imaging optical system 104 is widened. A light beam forms an image in a wider range than the range of the photoelectric conversion elements associated with one microlens 201, as shown in FIG. 6B. Since the range of only part of the light beam forms an image on the photoelectric conversion elements associated in advance with one microlens 201, information about a light beam expanded by the exit pupil 301 is lost. The information about the expanded light beam is formed into an image on photoelectric conversion elements associated with the adjacent microlens 201, as shown in FIG. 6B. The obtained LF data generates a crosstalk in some pixels corresponding to the adjacent microlenses 201. Even if the LF data is used, no preferable reconstructed image may be generated.

To prevent this, in the digital camera 100 according to the embodiment, the f-number of the compatible imaging optical system 104 is set from the first f-number (minimum f-number: an assumed maximum effective aperture) up to the second f-number (maximum f-number: an assumed minimum effective aperture). Each microlens of the microlens array 105 is designed as follows:

When an optical system having the first f-number is used, the width and height of a range where a light beam having passed through one microlens forms an image coincide with those of a range defined by all photoelectric conversion elements associated with the microlens;

As for the range where a light beam having passed through one microlens forms an image on the image sensor, the ratio of a value obtained when the optical system takes the second f-number, to a value obtained when it takes the first f-number is higher than the ratio of the first f-number to the second f-number.

Figure 6C:
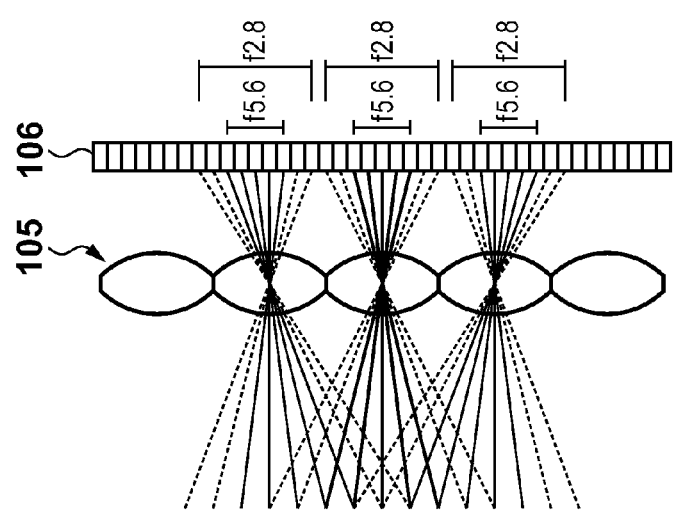

More specifically, the microlens array 105 uses microlenses having a distortion aberration characteristic in which light beams corresponding to f5.6 are not converged, but light beams outside those corresponding to f5.6 out of light beams corresponding to f2.8 are converged, as shown in FIG. 6C. An image which is formed via the microlens on photoelectric conversion elements associated with the microlens and then output is an image having so-called barrel distortion.

Figure 7:
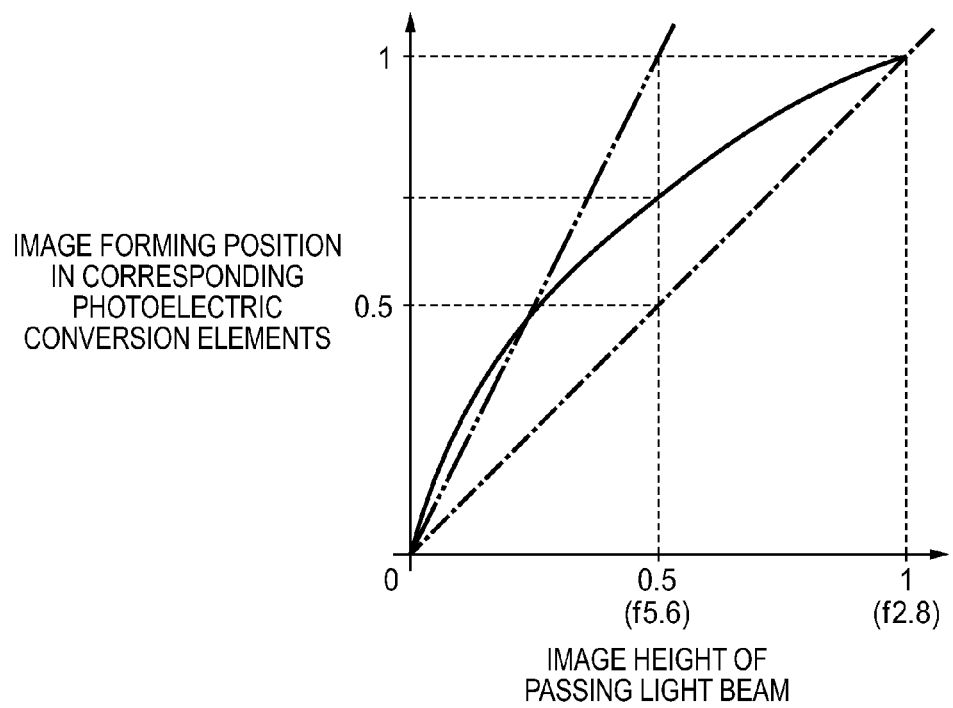
FIG. 7 is a graph showing the relationship between the image height and image forming position of a light beam having passed through the microlens according to the embodiment of the present invention.

The distortion aberration characteristic of the microlens used in the digital camera 100 according to the embodiment will be explained with reference to FIG. 7. FIG. 7 shows the relationship between the image height of a light beam (distance from the center of the optical axis of the imaging optical system 104) and the position of a photoelectric conversion element on which the light beam forms an image. The ordinate represents the image height, and the abscissa represents the image forming position. As for the ordinate, the center of photoelectric conversion elements associated with one microlens is defined as 0, and one end of the photoelectric conversion elements in the horizontal or vertical direction is defined as 1. In the example of FIG. 4B, $p_{44}$ at the center is defined as 0 and, for example, $p_{48}$ is defined as 1. As for the abscissa, (the radius of) the effective aperture for f2.8 is defined as 1.

Assuming that the focal length of the imaging optical system 104 does not change, the effective aperture for f5.6 is 0.5.

The relationship between the image height and the image forming position when each microlens of the microlens array 105 according to the embodiment is used exhibits a behavior as indicated by a solid line in FIG. 7. In FIG. 7, a chain line represents the relationship between the image height and the image forming position for $f_{micro}$=f2.8, and a two-dot chain line represents the relationship between the image height and the image forming position for $f_{micro}$=f5.6. As shown in FIG. 7, aberration of a light beam when the imaging optical system 104 takes f2.8 becomes stronger as the image height becomes larger. Light beams having passed through the assumed maximum effective aperture fall within photoelectric conversion elements associated with the microlens. That is, the image forming position of a light beam exhibiting a maximum image height among light beams having passed through the maximum effective aperture is 1. A light beam when the imaging optical system 104 takes f5.6 has a wider image forming range than that when the microlens takes f2.8. The image forming position when the imaging optical system 104 takes f5.6 is larger than the ratio of the f-numbers: 2.8/5.6=½. Hence, the resolution of a reconstructed image obtained from LF data can be increased.

Note that the LF data obtained by the above-described arrangement corresponds to an image containing distortion aberration. When generating a reconstructed image, the image processing unit 109 needs to perform aberration correction. More specifically, by looking up a conversion table for correcting the characteristic shown in FIG. 7, the image processing unit 109 corrects a combination of a pupil region corresponding to each pixel through which a light beam has passed, and the incident direction of the light beam. The image processing unit 109 generates a reconstructed image by using the corrected LF data.

In addition to distortion aberration by each microlens of the microlens array 105, the distortion aberration of the imaging optical system 104, that is, the main lens needs to be considered. The distortion aberration of the imaging optical system 104 is of the barrel type, similar to the microlens, or the pin-cushion type. In either case, the distortion aberration is corrected by looking up a conversion table for correcting the distortion aberration characteristic of the imaging optical system 104. The distortion aberration by each microlens of the microlens array 105 is preferably corrected at the stage of LF data before reconstruction. However, the distortion aberration of the imaging optical system 104, that is, the main lens is preferably corrected after generation of a reconstructed image. This is because information about the direction of a light beam entering each pixel is required in reconstruction of LF data.

The digital camera 100 according to the embodiment stores LF data containing the distortion aberration of an image by the microlens. However, LF data after correcting the distortion aberration in the microlens array 105 may be stored. At this time, LF data after correction becomes larger in the number of pixels than LF data before correction.

When the imaging optical system 104 having an f-number corresponding to an effective aperture smaller than the maximum effective aperture is used, photoelectric conversion elements associated with a microlens include pixels having no pixel value corresponding to a light beam, in addition to outputs (effective pixels) from elements on which a light beam forms an image. For this reason, LF data generated by extracting only pixels not included in a rectangular region corresponding to effective pixels may be stored when uncorrected LF data is stored and also when corrected LF data is stored.

Figure 8:
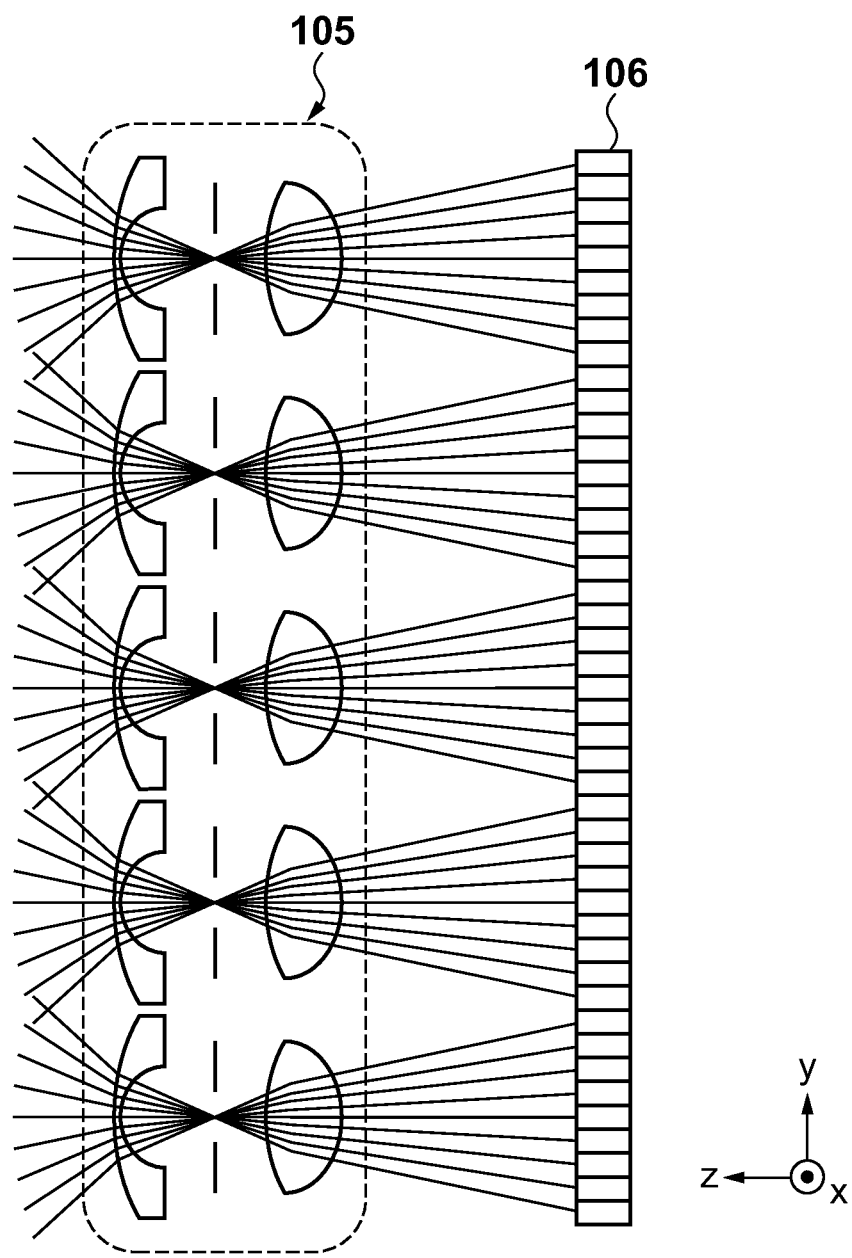
FIG. 8 is a view exemplifying another arrangement of the microlens array 105 according to the present invention.

The embodiment has described the microlens array 105 in which a lens having the above-described distortion aberration characteristic replaces each microlens of a conventional microlens array. However, the practice of the present invention is not limited to this. For example, the microlens array 105 may implement the above-described distortion aberration characteristic by using a fish-eye lens as each microlens, as shown in FIG. 8.

As described above, the image sensing apparatus according to the embodiment outputs preferable LF data corresponding to the imaging optical system having different f-numbers. More specifically, each microlens in the image sensing apparatus exhibits a distortion aberration characteristic in which the ratio of a range where a light beam having passed through the microlens forms an image on a predetermined number of pixels associated with the microlens when the imaging optical system takes the second f-number, to a range where a light beam having passed through the microlens forms an image when the imaging optical system takes the first f-number is higher than the ratio of the first f-number to the second f-number. By using this microlens, LF data capable of generating a preferable reconstructed image can be acquired for the imaging optical system having the first and second f-numbers.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (for example, computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2012-208896, filed Sep. 21, 2012, and 2013-187647, filed Sep. 10, 2013, which are hereby incorporated by reference herein in their entirety.

What is claimed is:

1. An image sensing apparatus including:
   an imaging optical system;
   an image sensor configured to include a plurality of pixels and photoelectrically convert a light beam having passed through the imaging optical system; and
   an array of microlenses configured to form, on the respective pixels of the image sensor, images of light beams different in a combination of a pupil region of the imaging optical system through which the light beam has passed, and an incident direction,
   wherein the microlens has a distortion aberration characteristic in which aberration becomes stronger as an image height in the microlens becomes higher.

2. The apparatus according to claim 1, wherein the microlens has a distortion aberration characteristic in which a width and height of a range where a light beam having passed through the microlens forms an image when the imaging optical system takes a first f-number coincide with a width and height of a range defined by the predetermined number of pixels associated with the microlens.

3. The apparatus according to claim 1, further comprising a correction unit configured to correct distortion aberration caused by the microlens for an image signal obtained by the photoelectric conversion.

4. The apparatus according to claim 3, further comprising a generation unit configured to generate a reconstructed image focused on a subject at a specific focal length by using the image signal for which said correction unit corrects the distortion aberration.

5. The apparatus according to claim 4, wherein said generation unit generates a reconstructed image by adding pixels associated with each microlens without correcting, by said correction unit, the image signal obtained by the photoelectric conversion.

6. The apparatus according to claim 1, further comprising a storage unit configured to store the image signal obtained by the photoelectric conversion.

7. The apparatus according to claim 1, further comprising:
   a correction unit configured to correct distortion aberration caused by the microlens for an image signal obtained by the photoelectric conversion; and
   a storage unit configured to store the image signal for which said correction unit corrects the distortion aberration.

8. The apparatus according to claim 1, wherein the microlens includes a fish-eye lens.

9. An image sensing apparatus including:
   an imaging optical system;
   an image sensor configured to include a plurality of pixels and photoelectrically convert a light beam having passed through the imaging optical system; and
   an array of microlenses configured to form, on the respective pixels of the image sensor, images of light beams different in a combination of a pupil region of the imaging optical system through which the light beam has passed, and an incident direction, comprising:
   a first correction unit configured to correct distortion aberration caused by the microlens for an image signal obtained by the photoelectric conversion;
   a second correction unit configured to correct distortion aberration caused by the imaging optical system; and
   a storage unit configured to encode and store an image output from said second correction unit.

10. The apparatus according to claim 9, further comprising a generation unit configured to generate a reconstructed image focused on a subject at a specific focal length by using the image signal for which said first correction unit corrects the distortion aberration,
   wherein said second correction unit corrects the distortion aberration caused by the imaging optical system for the reconstructed image.

11. An image sensing apparatus including:
   an imaging optical system configured to take a first f-number and a second f-number larger than the first f-number;
   an image sensor configured to include a plurality of pixels and photoelectrically convert a light beam having passed through the imaging optical system; and
   an array of microlenses configured to form, on the respective pixels of the image sensor, images of light beams different in a combination of a pupil region of the imaging optical system through which the light beam has passed, and an incident direction, each microlens being associated with a predetermined number of pixels of the image sensor, wherein the microlens has a distortion aberration characteristic in which a ratio of a range where a light beam having passed through the microlens forms an image on the predetermined number of pixels associated with the microlens when the imaging optical system takes the second f-number, to a range where a light beam having passed through the microlens forms an image when the imaging optical system takes the first f-number is higher than a ratio of the first f-number to the second f-number.

* * * * *